(12) United States Patent
Chen

(10) Patent No.: US 8,692,266 B2
(45) Date of Patent: Apr. 8, 2014

(54) CIRCUIT SUBSTRATE STRUCTURE

(71) Applicant: Kuo-Tso Chen, Hsinchu (TW)

(72) Inventor: Kuo-Tso Chen, Hsinchu (TW)

(73) Assignee: Optromax Electronics Co., Ltd, Hsinchu (TW)

( * ) Notice: Subject to any disclaimer, the term of this patent is extended or adjusted under 35 U.S.C. 154(b) by 0 days.

(21) Appl. No.: 13/854,965

(22) Filed: Apr. 2, 2013

(65) Prior Publication Data

US 2013/0214422 A1    Aug. 22, 2013

Related U.S. Application Data

(62) Division of application No. 13/190,501, filed on Jul. 26, 2011, now Pat. No. 8,431,454.

(30) Foreign Application Priority Data

Jul. 30, 2010   (TW) ............................... 99125377 A

(51) Int. Cl.
*H01L 29/207* (2006.01)
*H01L 21/70* (2006.01)
*H01L 23/52* (2006.01)

(52) U.S. Cl.
USPC ............ 257/93; 257/374; 257/446; 257/499; 257/501; 257/502; 257/503; 257/504; 257/505; 257/506; 257/507; 257/508; 257/510; 257/522; 257/524; 257/525; 257/526; 438/196; 438/207; 438/218; 438/219; 438/221; 438/240; 438/295; 438/296; 438/355; 438/359; 438/404; 438/424; 438/594; 438/981

(58) Field of Classification Search
USPC ........... 257/93, 374, 446, 499, 501–508, 510, 257/522, 524–526; 438/196, 207, 208, 218, 438/219, 221, 240, 295, 296, 355, 359, 404, 438/421, 424, 594, 981
See application file for complete search history.

(56) References Cited

U.S. PATENT DOCUMENTS

| | | | | |
|---|---|---|---|---|
| 5,436,188 | A * | 7/1995 | Chen .............................. | 438/397 |
| 5,753,536 | A * | 5/1998 | Sugiyama et al. ............ | 438/108 |
| 2002/0146853 | A1 * | 10/2002 | Karpov et al. ................. | 438/20 |
| 2005/0101101 | A1 * | 5/2005 | DeLoach et al. .............. | 438/424 |

FOREIGN PATENT DOCUMENTS

JP          2001030485         *    2/2001

* cited by examiner

*Primary Examiner* — Jae Lee
*Assistant Examiner* — Junaiden Mirsalahuddin
(74) *Attorney, Agent, or Firm* — Jianq Chyun IP Office

(57) ABSTRACT

A circuit substrate structure including a substrate, a dielectric stack layer, a first plating layer and a second plating layer is provided. The substrate has a pad. The dielectric stack layer is disposed on the substrate and has an opening exposing the pad, wherein the dielectric stack layer includes a first dielectric layer, a second dielectric layer and a third dielectric layer located between the first dielectric layer and the second dielectric layer, and there is a gap between the portion of the first dielectric layer surrounding the opening and the portion of the second dielectric layer surrounding the opening. The first plating layer is disposed at the dielectric stack layer. The second plating layer is disposed at the pad, wherein the gap isolates the first plating layer from the second plating layer.

6 Claims, 5 Drawing Sheets

CIRCUIT SUBSTRATE STRUCTURE

CROSS-REFERENCE TO RELATED APPLICATION

This application is a divisional of and claims the priority benefit of U.S. application Ser. No. 13/190,501 filed on Jul. 26, 2011, now allowed, which claims the priority benefit of Taiwan application serial no. 99125377, filed on Jul. 30, 2010. The entirety of each of the above-mentioned patent applications is hereby incorporated by reference herein and made a part of specification.

BACKGROUND OF THE INVENTION

1. Field of the Invention

The invention generally relates to a circuit substrate structure, and more particularly, to a circuit substrate structure with an active surface having a metallic plating layer. The structure of the invention are suitable for a semiconductor substrate with miniaturized electronic devices already made and a semiconductor substrate without other miniaturized electronic devices and meanwhile can be further applicable in fabricating a reflective layer disposed on a ceramic substrate with a circuit and a metallic substrate with a circuit.

2. Description of Related Art

Along with the progress of semiconductor technology, a light-emitting diode (LED) has larger and larger power, and the intensity of the emitted light thereof becomes higher and higher. In addition, LEDs have advantages, such as power-saving, long lifetime, environment-friendly, fast starting, small size and so on, so that LEDs are widely applied in illumination equipment, traffic sign light, display, optical mouse and the like and would gradually substitute traditional fluorescent lamps.

In an LED package structure, there are an LED unit and a control unit, in which the control unit has pads thereon for electrically connecting the LEDs. In order to effectively reflect the light emitted from the LED unit to advance light-emitting efficiency, a reflective layer can be employed and disposed in the LED package structure, so that the light emitted from the LED unit can be effectively reflected by the reflective layer to advance light-emitting efficiency.

For example, a reflective layer made of silver (Ag) has the best effect, in which the control unit can be coated with silver thereon by plating, evaporation or vacuum sputtering. Plating silver is not a standard semiconductor process and has a practical difficulty when mass producing semiconductor substrates, while when making evaporation or vacuum sputtering to plate a reflective layer on the control unit, each pad may contact the reflective layer to electrically connect each other to result in an unexpected electrical connection, which would affect the normal operation of the LED unit. As a result, when a semiconductor device and a reflective layer are integrated into a single chip, how to avoid the reflective layer plated on a control unit and fabricated by evaporation or vacuum sputtering to contact pads becomes an important project in fabricating an LED package structure.

SUMMARY OF THE INVENTION

Accordingly, the invention is directed to a circuit substrate structure, which is able to avoid an unexpected electrical connection between each pad thereof and the rest pads through a connection between the plating layers.

The invention provides a circuit substrate structure, which includes a substrate, a dielectric stack layer, a first plating layer and a second plating layer. The substrate has a pad. The dielectric stack layer is disposed on the substrate and has an opening exposing the pad, in which the dielectric stack layer includes a first dielectric layer, a second dielectric layer and a third dielectric layer located between the first dielectric layer and the second dielectric layer, and there is a gap between the portion of the first dielectric layer surrounding the opening and the portion of the second dielectric layer surrounding the opening. The first plating layer is disposed at the dielectric stack layer and the second plating layer is disposed at the pad, in which the gap isolates the first plating layer from the second plating layer.

In an embodiment of the invention, the material of the above-mentioned dielectric stack layer includes silicon oxide ($SiO_2$) or silicon nitride ($Si_3N_4$).

In an embodiment of the invention, the material of the above-mentioned first dielectric layer and the second dielectric layer includes silicon oxide produced through a reaction by using tetraethylorthosilicate (TEOS) and the material of the third dielectric layer includes borophosphosilicate glass (BPSG).

In an embodiment of the invention, the material of the above-mentioned first plating layer and the second plating layer includes silver (Ag).

In an embodiment of the invention, the above-mentioned dielectric stack layer has a saw-teeth shape structure at the place of the gap.

In an embodiment of the invention, the circuit substrate is a semiconductor substrate with miniaturized electronic devices, a semiconductor substrate with metallic wires, a ceramic substrate with a circuit or a metallic substrate with a circuit.

Based on the depiction above, in the circuit substrate structure of the invention, there is a gap between the portion of the first dielectric layer surrounding the opening and the portion of the second dielectric layer surrounding the opening. In this way, during performing a plating process on the dielectric stack layer and the pad, the gap has isolation function, so that a first plating layer and a second plating layer without contacting the first plating layer are respectively formed at the dielectric stack layer and the pad, which avoids an unexpected electrical connection between each pad thereof and the rest pads through the connection between the plating layers to ensure the normal operation of the circuit substrate.

The structure of the invention are suitable for a semiconductor substrate with miniaturized electronic devices made already and a semiconductor substrate without other miniaturized electronic devices and meanwhile can be further applicable in fabricating a reflective layer disposed on a ceramic substrate with a circuit and a metallic substrate with a circuit.

Other objectives, features and advantages of the invention will be further understood from the further technological features disclosed by the embodiments of the invention in which there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The structure and the method provided by the invention are suitable for a semiconductor substrate with miniaturized electronic devices made already and a semiconductor substrate without other micro electronic devices and meanwhile can be further applicable in fabricating a reflective layer disposed on a ceramic substrate with a circuit and a metallic substrate with a circuit.

Figure 1A:
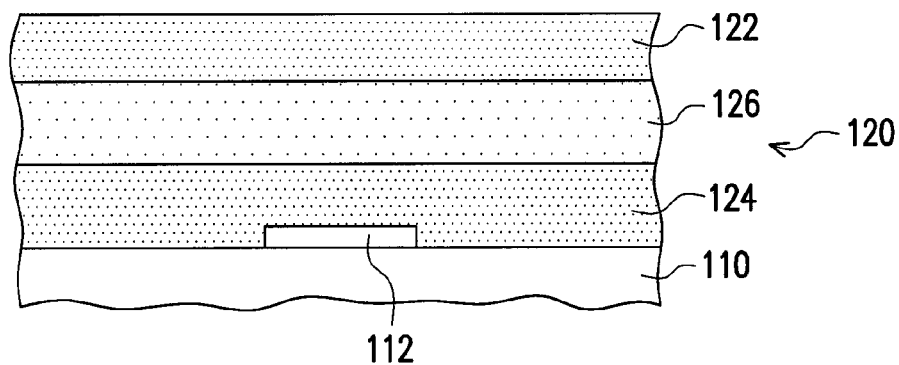
FIGS. 1A-1E are schematic flowcharts showing a fabricating process of circuit substrate according to an embodiment of the invention.

FIGS. 1A-1E are schematic flowcharts showing a fabricating process of circuit substrate according to an embodiment of the invention, in which the process is a semiconductor process as an example. Referring to FIG. 1A, first, a substrate 110 and a dielectric stack layer 120 are provided, in which the substrate 110 has a pad 112, the dielectric stack layer 120 is disposed on the substrate 110 and overlays the pad 112, and the dielectric stack layer 120 includes a first dielectric layer 122, a second dielectric layer 124 and a third dielectric layer 126 located between the first dielectric layer 122 and the second dielectric layer 124. In the embodiment, the second dielectric layer 124, the third dielectric layer 126 and the first dielectric layer 122 are sequentially deposed on the substrate 110 by using chemical vapor deposition (CVD) method.

In the embodiment, the material of the dielectric stack layer 120 includes silicon oxide. In more details, the material of the first dielectric layer 122 and the second dielectric layer 124 is, for example, silicon oxide produced through a reaction in vacuum plasma by using tetraethylorthosilicate (TEOS) and the material of the third dielectric layer 126 is, for example, silicon glass doped with boron-phosphor (BP), so that the etching rate of the third dielectric layer 126 is greater than the etching rate of the first dielectric layer 122 and the second dielectric layer 124, which the invention is not limited to. In other embodiments, the material of the dielectric stack layer 120 can be silicon nitride or a combo structure formed by stacking silicon oxide and silicon nitride as well, and also can be that by doping an appropriate substance into the first dielectric layer 122, the second dielectric layer 124 and the third dielectric layer 126 so that the etching rate of the third dielectric layer 126 is greater than the etching rate of the first dielectric layer 122 and the second dielectric layer 124.

Figure 1B:
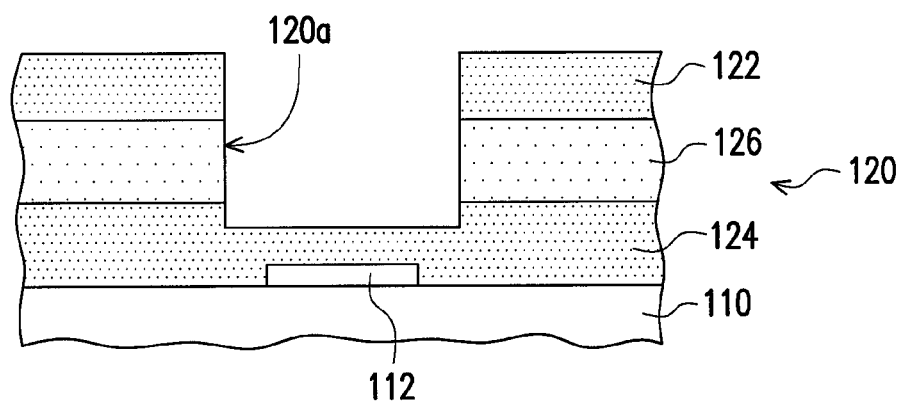

Next, referring to FIG. 1B, an opening 120a is formed at the dielectric stack layer 120, in which the opening 120a is corresponding to the pad 112. The method to form the opening 120a is, for example, a photomask process. In more details, a patterned photomask is formed on the dielectric stack layer 120, followed by removing the portion of the dielectric stack layer 120 exposed by the patterned photomask to form the opening 120a.

Figure 1C:
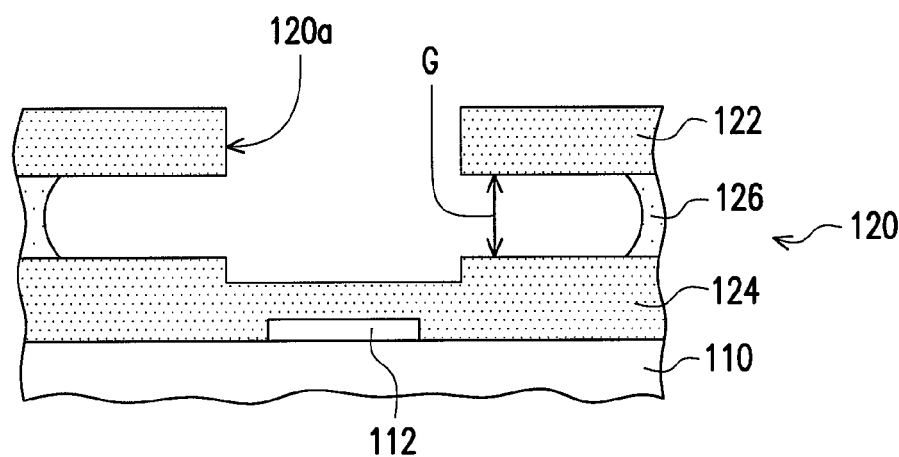

Then, referring to FIG. 1C, a wet etching process is performed on the dielectric stack layer 120 to remove the portion of the third dielectric layer 126 surrounding the opening 120a so as to form a gap G between the portion of the first dielectric layer 122 surrounding the opening 120a and the portion of the second dielectric layer 124 surrounding the opening 120a. In more details, for example, hydrogen fluoride (HF) solution is used to serve as an etching liquid to perform a wet etching process on the dielectric stack layer 120. Since the etching rate of the third dielectric layer 126 is greater than the etching rate of the first dielectric layer 122 and the second dielectric layer 124, the etched extent of the third dielectric layer 126 is larger than the etched extents of the first dielectric layer 122 and the second dielectric layer 124, and a gap G as shown by FIG. 1C is formed.

Figure 1D:
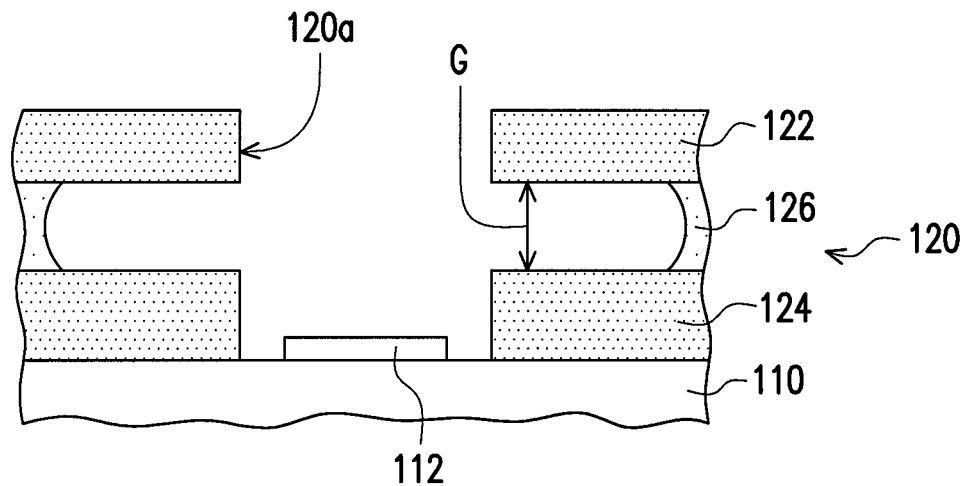

Referring to FIG. 1D, a portion of the dielectric stack layer 120 is removed to expose the pad 112, in which the method of removing the portion of the dielectric stack layer 120 is, for example, plasma etching. Then, referring to FIG. 1E, a plating process is performed on the dielectric stack layer 120 and the pad 112 to respectively form a first plating layer 120b and a second plating layer 112a at the dielectric stack layer 120 and the pad 112 to finish the fabrication of the circuit substrate structure 100. The plating process is, for example, evaporation or sputtering.

Since there is a gap G between the portion of the first dielectric layer 122 surrounding the opening 120a and the portion of the second dielectric layer 124 surrounding the opening 120a, during forming the first plating layer 120b and the second plating layer 112a through a plating process, the first plating layer 120b formed at the dielectric stack layer 120 and the second plating layer 112a formed at the pad 112 are isolated by the gap G and separated from each other.

Figure 1E:
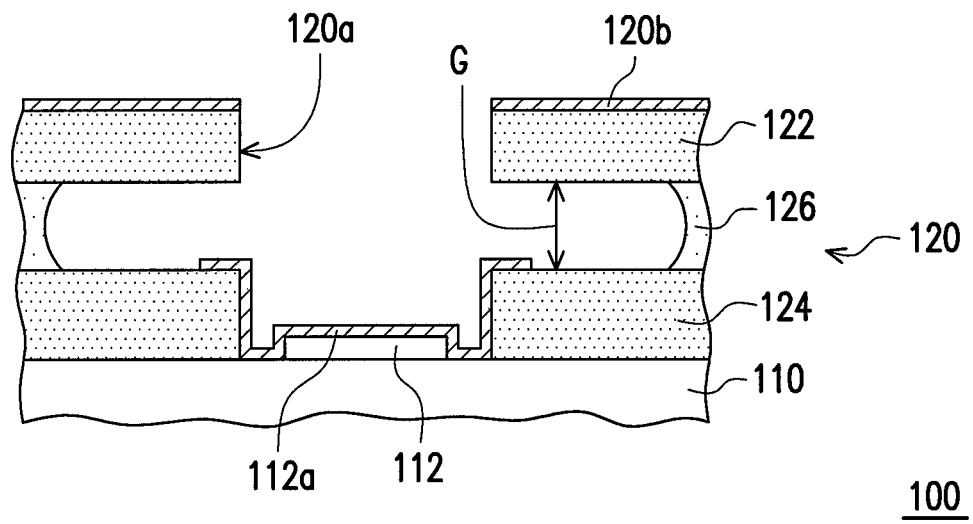

The circuit substrate structure 100 of FIG. 1E includes a substrate 110, a dielectric stack layer 120, a first plating layer 120b and a second plating layer 112a. The substrate 110 has a pad 112, the dielectric stack layer 120 is disposed on the substrate 110 and has an opening 120 to expose the pad 112, in which the dielectric stack layer 120 includes a first dielectric layer 122, a second dielectric layer 124 and a third dielectric layer 126 located between the first dielectric layer 122 and the second dielectric layer 124. There is a gap G between the portion of the first dielectric layer 122 surrounding the opening 120 and the portion of the second dielectric layer 124 surrounding the opening 120. The first plating layer 120b is disposed at the dielectric stack layer 120 and the second plating layer 112a is disposed at the pad 112, in which the gap G isolates the first plating layer 120b from the second plating layer 112a. As a result, the invention can be able to avoid an unexpected electrical connection between each pad 112 thereof and the rest pads through the connection between the first plating layer 120b and the second plating layer 112a and thereby the normal operation of the circuit substrate structure is ensured.

In the circuit substrate structure 100 of the embodiment, the material of the first dielectric layer 122 and the second dielectric layer 124 is, for example, silicon oxide produced through a reaction in vacuum plasma by using tetraethylorthosilicate (TEOS) and the material of the third dielectric layer 126 is, for example, silicon glass doped with boron-phosphor (BP) or other kinds of silicon oxide. In addition, the material of the first plating layer 120b and the second plating layer 112a is, for example, silver. As an example, the circuit substrate structure 100 can be the substrate in an LED package structure and both the first plating layer 120b and the second plating layer 112a can be reflective layers in the LED package structure for reflecting the light emitted from the LED unit.

Figure 2A:
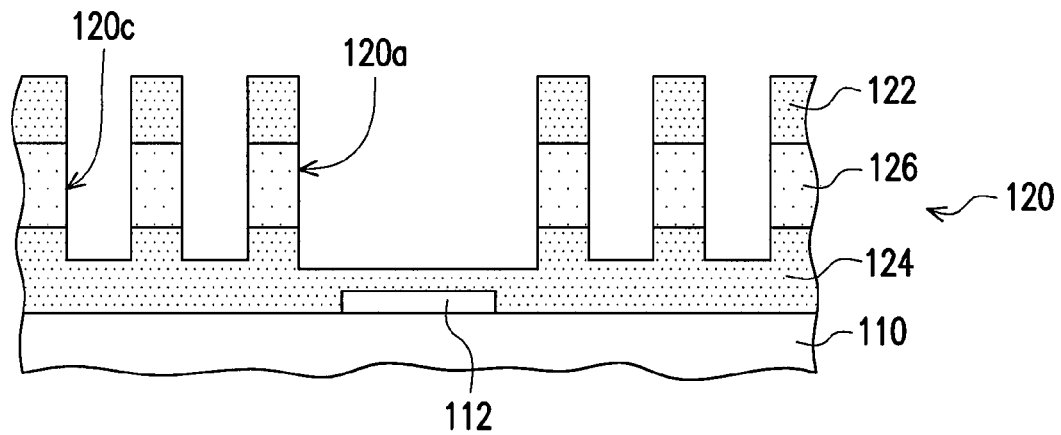
FIGS. 2A-2E are schematic flowcharts showing a fabricating process of circuit substrate according to another embodiment of the invention.
Figure 2B:
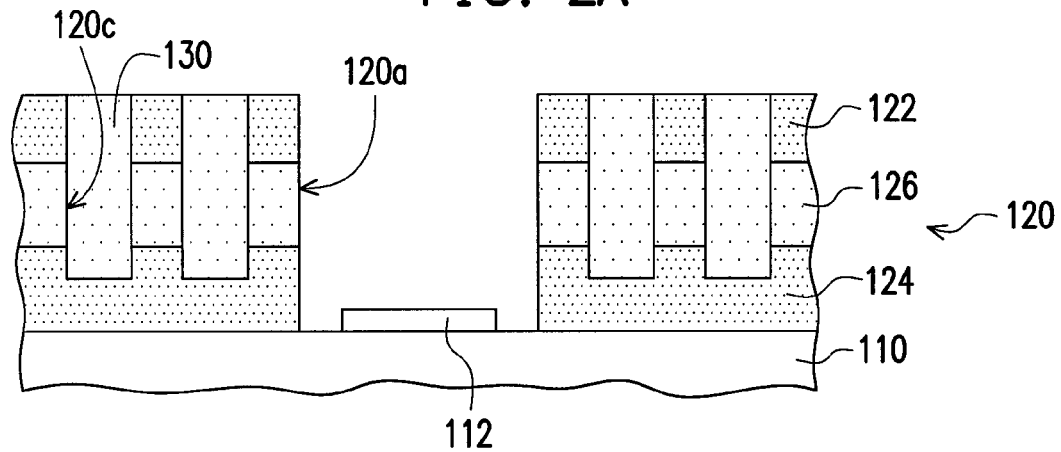
Figure 2C:
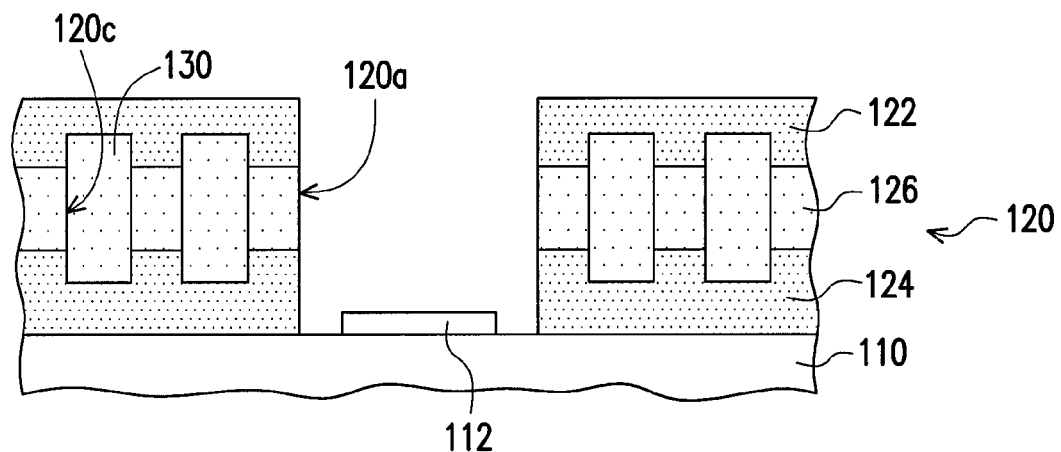
Figure 2D:
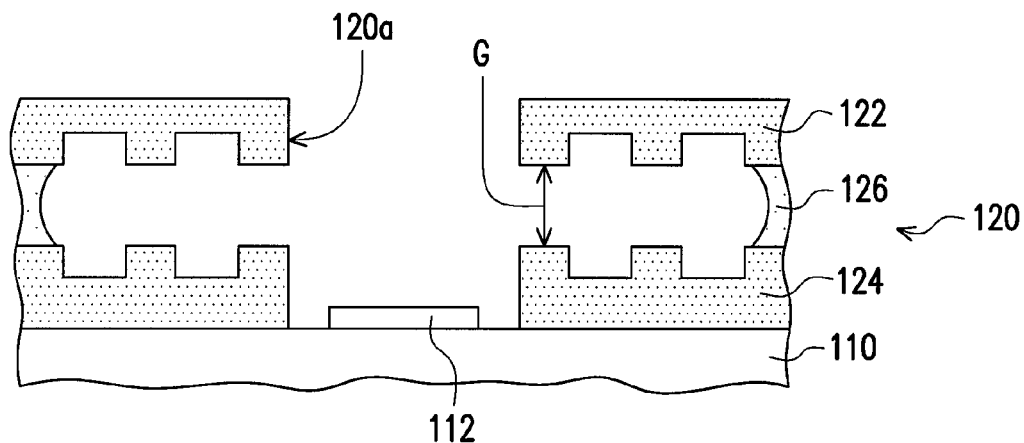
Figure 2E:
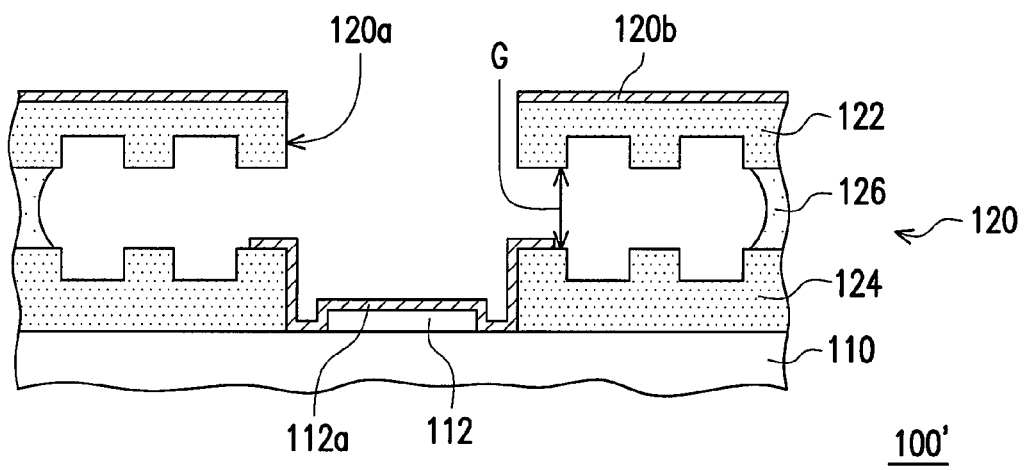
Figure 3:
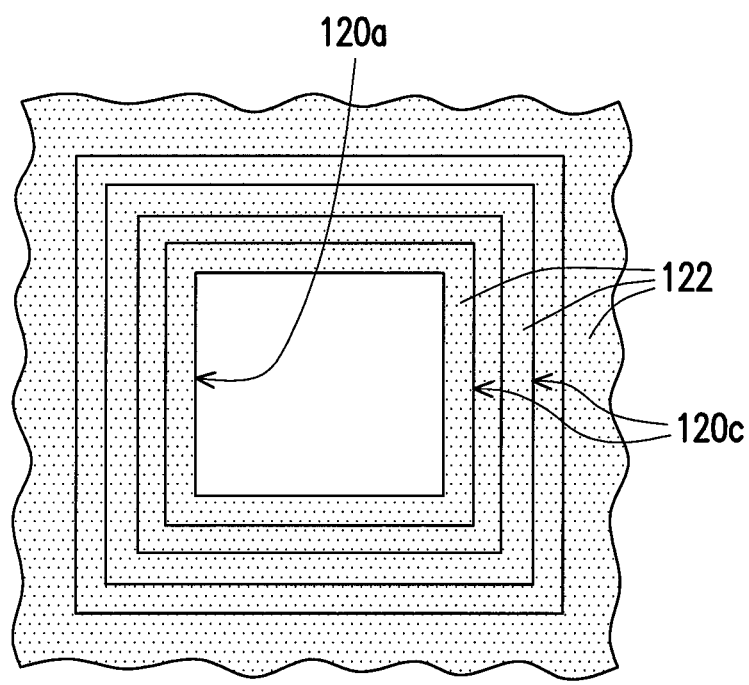
FIG. 3 is a top view diagram of the dielectric stack layer of FIG. 2A.

FIGS. 2A-2E are schematic flowcharts showing a fabricating process of circuit substrate according to another embodiment of the invention and FIG. 3 is a top view diagram of the dielectric stack layer of FIG. 2A. Referring to FIGS. 2A and 3, after forming the structure shown by FIG. 1B, a patterned recess 120c is formed at the dielectric stack layer 120. Then in FIG. 2B, a portion of the dielectric stack layer 120 is removed to expose the pad 112 and a dielectric material 130 filling the patterned recess 120c is formed, in which the etching rate of the dielectric material 130 is greater than the etching rate of the first dielectric layer 122 and the second dielectric layer 124. The material of the dielectric material 130 is the same as, for example, the material of the third dielectric layer 126. The material of the dielectric material 130 and the third dielectric layer 126 is, for example, silicon glass doped with boron-phosphor (BP).

Referring to FIG. 2C, the dielectric material 130 is overlapped by increasing the thickness of the dielectric stack layer 120. In more details, the method of increasing the thickness of the dielectric stack layer 120 is, for example, to dispose a dielectric layer with the same material as the material of the first dielectric layer 122 on the first dielectric layer 122. Referring to FIG. 2D, during performing a wet etching process, parts of the third dielectric layer 126 and the dielectric material 130 are removed so that the dielectric stack layer 120 has a saw-teeth shape structure at the place of the gap G. As shown by FIG. 2E, when a plating process is performed on the dielectric stack layer 120 and the pad 112 to respectively form the first plating layer 120b and the second plating layer 112a, it can further avoid the first plating layer 120b and the second plating layer 112a from extending along the inner-wall of the gap G and from contacting each other.

When the recess 120c is quite small, the dielectric material 130 is not needed to fill the patterned recess 120c. Instead, the thickness of the dielectric stack layer 120 should be directly increased and the gap G should at the original position of the recess 120c should be kept. In this way, during forming the gap G, there is also a saw-teeth shape structure formed at the place of the gap G.

A circuit substrate structure 100' shown by FIG. 2E includes a substrate 110, a dielectric stack layer 120, a first plating layer 120b and a second plating layer 112a. The substrate 110 has a pad 112, the dielectric stack layer 120 is disposed on the substrate 110 and has an opening 120 to expose the pad 112, in which the dielectric stack layer 120 includes a first dielectric layer 122, a second dielectric layer 124 and a third dielectric layer 126 located between the first dielectric layer 122 and the second dielectric layer 124.

There is a gap G between the portion of the first dielectric layer 122 surrounding the opening 120 and the portion of the second dielectric layer 124 surrounding the opening 120 and the dielectric stack layer 120 has a saw-teeth shape structure at the place of the gap G. The first plating layer 120b is disposed at the dielectric stack layer 120 and the second plating layer 112a is disposed at the pad 112, in which the gap G and the saw-teeth shape structure isolate the first plating layer 120b from the second plating layer 112a. As a result, the invention can be able to avoid an unexpected electrical connection between each pad 112 thereof and the rest pads through the connection between the first plating layer 120b and the second plating layer 112a and thereby the normal operation of the circuit substrate structure is ensured.

In the circuit substrate structure 100' of the embodiment, the material of the first dielectric layer 122 and the second dielectric layer 124 is, for example, silicon oxide or silicon nitride produced through a reaction in vacuum plasma and the material of the third dielectric layer 126 is, for example, silicon glass doped with boron-phosphor (BP) or other kinds of silicon oxide. In addition, the material of the first plating layer 120b and the second plating layer 112a is, for example, silver. As an example, the circuit substrate structure 100' can be applied in an LED package structure and both the first plating layer 120b and the second plating layer 112a can be reflective layers in the LED package structure for reflecting the light emitted from an LED unit.

In summary, in a circuit substrate structure of the invention, there is a gap between the portion of the first dielectric layer surrounding the opening and the portion of the second dielectric layer surrounding the opening. In this way, during performing a plating process on the dielectric stack layer and the pad, the gap has isolation function, so that a first plating layer and a second plating layer without contacting the first plating layer are respectively formed at the dielectric stack layer and the pad, which avoids an unexpected electrical connection between each pad thereof and the rest pads through the connection between the plating layers to ensure the normal operation of the circuit substrate. In addition, the dielectric stack layer could have a saw-teeth shape structure at the place of the gap, such that the plating layer on the dielectric stack layer is further prevented from electrically connecting to the pad along a inner wall of the gap.

The structure and the method of the invention are suitable for a semiconductor substrate with miniaturized electronic devices made already and a semiconductor substrate without other miniaturized electronic devices and meanwhile can be further applicable in fabricating a reflective layer disposed on a ceramic substrate with a circuit and a metallic substrate with a circuit It will be apparent to those skilled in the art that various modifications and variations can be made to the structure of the invention without departing from the scope or spirit of the invention. In view of the foregoing, it is intended that the invention covers modifications and variations of this invention provided they fall within the scope of the following claims and their equivalents.

What is claimed is:

1. A circuit substrate structure, comprising:
   a substrate, having a pad;
   a dielectric stack layer, disposed on the substrate and having an opening exposing the pad, wherein the dielectric stack layer comprises a first dielectric layer, a second dielectric layer and a third dielectric layer located between the first dielectric layer and the second dielectric layer, and there is a gap between the portion of the first dielectric layer surrounding the opening and the portion of the second dielectric layer surrounding the opening;
   a first plating layer, disposed at the dielectric stack layer; and
   a second plating layer, disposed at the pad, and extending onto the substrate and the second dielectric layer, wherein the gap isolates the first plating layer from the second plating layer located on the substrate and the second dielectric layer.

2. The circuit substrate structure as claimed in claim 1, wherein the material of the dielectric stack layer comprises silicon oxide ($SiO_2$) or silicon nitride ($Si_3N_4$).

3. The circuit substrate structure as claimed in claim 1, wherein the material of the first dielectric layer and the second dielectric layer comprises silicon oxide produced through a reaction in vacuum plasma by using tetraethylorthosilicate (TEOS) and the material of the third dielectric layer comprises borophosphosilicate glass (BPSG).

4. The circuit substrate structure as claimed in claim 1, wherein the material of the first plating layer and the second plating layer comprises silver (Ag).

5. The circuit substrate structure as claimed in claim 1, wherein the dielectric stack layer has a saw-teeth shape structure at the place of the gap.

6. The circuit substrate structure as claimed in claim 1, wherein the circuit substrate is a semiconductor substrate with miniaturized electronic devices, a semiconductor substrate with metallic wires, a ceramic substrate with a circuit or a metallic substrate with a circuit.

* * * * *